United States Patent
Zhang et al.

(10) Patent No.: US 11,360,378 B2
(45) Date of Patent: Jun. 14, 2022

(54) PHASE SHIFT MASK, ARRAY SUBSTRATE, FABRICATION METHOD THEREOF AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiaoxiang Zhang, Beijing (CN); Mingxuan Liu, Beijing (CN); Huibin Guo, Beijing (CN); Wenqing Xu, Beijing (CN); Xiaolong Li, Beijing (CN); Zumou Wu, Beijing (CN); Yongzhi Song, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 538 days.

(21) Appl. No.: 16/346,192

(22) PCT Filed: Nov. 1, 2018

(86) PCT No.: PCT/CN2018/113454
§ 371 (c)(1),
(2) Date: Apr. 30, 2019

(87) PCT Pub. No.: WO2019/153804
PCT Pub. Date: Aug. 15, 2019

(65) Prior Publication Data
US 2021/0333704 A1    Oct. 28, 2021

(30) Foreign Application Priority Data
Feb. 11, 2018 (CN) .......... 201810142882.3

(51) Int. Cl.
G03F 1/26 (2012.01)
H01L 29/66 (2006.01)
H01L 27/12 (2006.01)

(52) U.S. Cl.
CPC ............ G03F 1/26 (2013.01); H01L 27/1288 (2013.01); H01L 29/66742 (2013.01)

(58) Field of Classification Search
CPC .. G03F 1/26; H01L 27/1288; H01L 29/66742
(Continued)

(56) References Cited

U.S. PATENT DOCUMENTS 8,067,132 B2    11/2011  Takushima et al.
2003/0165754 A1*  9/2003  Wang ................... G03F 1/26
                                                            430/22
(Continued)

FOREIGN PATENT DOCUMENTS

CN    1633625 A    6/2005
CN    101075086 A    11/2007
(Continued)

OTHER PUBLICATIONS

International Search Report dated Feb. 13, 2019, issued in counterpart Application No. PCT/CN2018/113454 (12 pages).
(Continued)

Primary Examiner — Tong-Ho Kim
(74) Attorney, Agent, or Firm — WHDA, LLP

(57) ABSTRACT

A display panel includes a method of fabricating an array substrate. The method includes forming a metal layer (1) on a substrate, and patterning the metal layer (1) using a phase shift mask to form a pattern of metal wiring. The phase shift mask includes a substrate and a wiring light shielding portion (02) on the substrate (01). The wiring light shielding portion (02) includes a light shielding region (021) and a phase shift region (022). In a direction perpendicular to the
(Continued)

extending direction of the wiring light shielding portion (02) a width of the light shielding region (021) is larger than a width of the pattern of the metal wiring formed by the wiring light shielding portion (02).

17 Claims, 10 Drawing Sheets

(58) Field of Classification Search
USPC .......................................................... 438/158
See application file for complete search history.

(56) References Cited

U.S. PATENT DOCUMENTS

| | | |
|---|---|---|
| 2006/0183033 A1 | 8/2006 | Misaka |
| 2007/0148936 A1* | 6/2007 | Ohnuma ............. H01L 27/1214 |
| | | 438/585 |
| 2010/0279450 A1* | 11/2010 | Fang ..................... H01L 27/124 |
| | | 438/34 |
| 2015/0301443 A1 | 10/2015 | Li |

FOREIGN PATENT DOCUMENTS

| | | |
|---|---|---|
| CN | 101238412 A | 8/2008 |
| CN | 101738846 A | 6/2010 |
| CN | 103969940 A | 8/2014 |
| CN | 108363270 A | 8/2018 |
| JP | 2000-66367 A | 3/2000 |
| JP | 2004-302263 A | 10/2004 |

OTHER PUBLICATIONS

Office Action dated Dec. 2, 2019, issued in counterpart CN Application No. 201810142882.3, with English translation (17 pages).

* cited by examiner

PHASE SHIFT MASK, ARRAY SUBSTRATE, FABRICATION METHOD THEREOF AND DISPLAY APPARATUS

CROSS-REFERENCE TO RELATED APPLICATIONS

This application claims benefit of the filing date of Chinese Patent Application No. 201810142882.3 filed on Feb. 11, 2018, the disclosure of which is hereby incorporated in its entirety by reference.

TECHNICAL FIELD

This disclosure relates to a display technology, in particular, to a phase shift mask, an array substrate, a fabrication method thereof, and a display apparatus.

BACKGROUND

A mask, also referred to as a photo mask, is a linking bridge between the design and the process manufacturing. With the improvement of the design technology and the manufacturing process, a phase shift mask (PSM) is used at present. The PSM generally includes a substrate, and a light shielding portion and a light transmitting portion on the substrate. The light shielding portion is generally made of metal chromium and a phase shifting material surrounding the chromium. When the phase shift mask is utilized during an exposure process, the light passing through the phase shifting material produces a 180-degree phase change. Because of the offset interference (that is, light interference is obstructed), the resolution of the pattern formed by the phase shift mask can be improved.

BRIEF SUMMARY

Accordingly, one example of the present is a method of fabricating an array substrate. The method of fabricating an array substrate may include forming a metal layer on a substrate and patterning the metal layer using a phase shift mask to form a pattern of metal wiring. The phase shift mask may include a substrate and a wiring light shielding portion on the substrate. The wiring light shielding portion may include a light shielding region and a phase shifting region. In a direction perpendicular to an extension direction of the wiring light shielding portion, a width of the light shielding region may be larger than a width of the pattern of the metal wiring formed by the wiring light shielding portion.

Before the metal layer is formed on the substrate, the fabrication method may further include forming a pattern of a gate electrode on the substrate, forming a gate insulating layer covering the pattern of the gate electrode, and forming a pattern of a semiconductor layer on the gate insulating layer.

The phase shift mask may further include a channel light transmitting portion and two electrode light shielding portions on both opposite sides of the channel light transmitting portion. Patterning the metal layer using the phase shift mask may further include forming a pattern of a drain electrode and a pattern of a source electrode by the electrode light shielding portions, and a channel between the pattern of the drain electrode and the pattern of the source electrode. A difference between the width of the light shielding region and the width of the pattern of the metal wiring may be a compensation width, and the compensation width may be negatively correlated to a width of the channel light transmitting portion.

In one embodiment, the compensation width and the width of the channel light transmitting portion meets the following relationship:

$$\begin{cases} \dfrac{y}{2} = Kx + b \\ -1 \le K \le -2 \\ 3 \le b \le 4 \end{cases}$$

wherein y represents the compensation width, x represents the width of the channel light transmission portion, and K and b are constants.

In one embodiment, the compensation width and the width of the channel light transmitting portion meet the following relationship:

$$\begin{cases} \dfrac{y}{2} = Kx + b + 0.1 * \Delta T \\ -1 \le K \le -2 \\ 3 \le b \le 4 \end{cases}$$

wherein y represents the compensation width, x represents the width of the channel light transmitting portions, and ΔT represents a difference between a thickness of photoresist in a region of the channel light transmitting portion and a thickness of photoresist in a region of the wiring light shielding portion. In one embodiment, K is approximately equal to 1.17 and b is approximately equal to 3.52.

The wiring light shielding portion may include a light shielding layer and a phase shifting layer, the light shielding layer may cover the light shielding region, and the phase shifting layer may cover at least the phase shifting region. The phase shifting layer may cover both the light shielding region and the phase shifting region. A shape of the wiring light shielding portion may be a strip. The light shielding layer may be made of chromium. The phase shifting layer may be made of a phase shifting material, wherein the phase shifting material may be configured to enable light to generate phase change of 180 degrees.

Another example of the present disclosure is an array substrate fabricated by the method according to one embodiment of the present disclosure.

Another example of the present disclosure is a display apparatus comprising the array substrate according to one embodiment of the present disclosure.

Another example of the present disclosure is a phase shift mask. The phase shift mask includes a substrate and a wiring light shielding portion on the substrate. The wiring light shielding portion may include a light shielding region and a phase shifting region, and in a direction perpendicular to an extension direction of the wiring light shielding portion, a width of the light shielding region may be larger than a width of a pattern formed by the wiring light shielding portion.

The phase shift mask may further include a channel light transmitting portion and two electrode light shielding portions respectively on both opposite sides of the channel light transmitting portion. A difference between the width of the light shielding region and the width of the pattern may be a compensation width, and the compensation width may be negatively correlated to a width of the channel light transmitting portion.

In one embodiment, the compensation width and the width of the channel light transmitting portion meets the following relationship:

$$\begin{cases} \frac{y}{2} = Kx + b \\ -1 \leq K \leq -2 \\ 3 \leq b \leq 4 \end{cases}$$

wherein y represents the compensation width, x represents the width of the channel light transmission portion, and K and b are constants.

In one embodiment, the phase shift mask according to claim 16, wherein the compensation width and the width of the channel light transmitting portion meet the following relationship:

$$\begin{cases} \frac{y}{2} = Kx + b + 0.1 * \Delta T \\ -1 \leq K \leq -2 \\ 3 \leq b \leq 4 \end{cases}$$

wherein y represents the compensation width, and x represents the width of the channel light transmitting portions, the $\Delta T$ represents a difference between a thickness of photoresist in a corresponding region of the channel light transmitting portion and a thickness of photoresist in a corresponding region of the wiring light shielding portion during exposure. In one embodiment, K is approximately equal to 1.17 and b is approximately equal to 3.52.

The wiring light shielding portion may include a light shielding layer and a phase shifting layer. In one embodiment, the light shielding layer covers the light shielding region, and the phase shifting layer covers at least the phase shifting region. In one embodiment, the phase shifting layer covers both the light shielding region and the phase shifting region.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
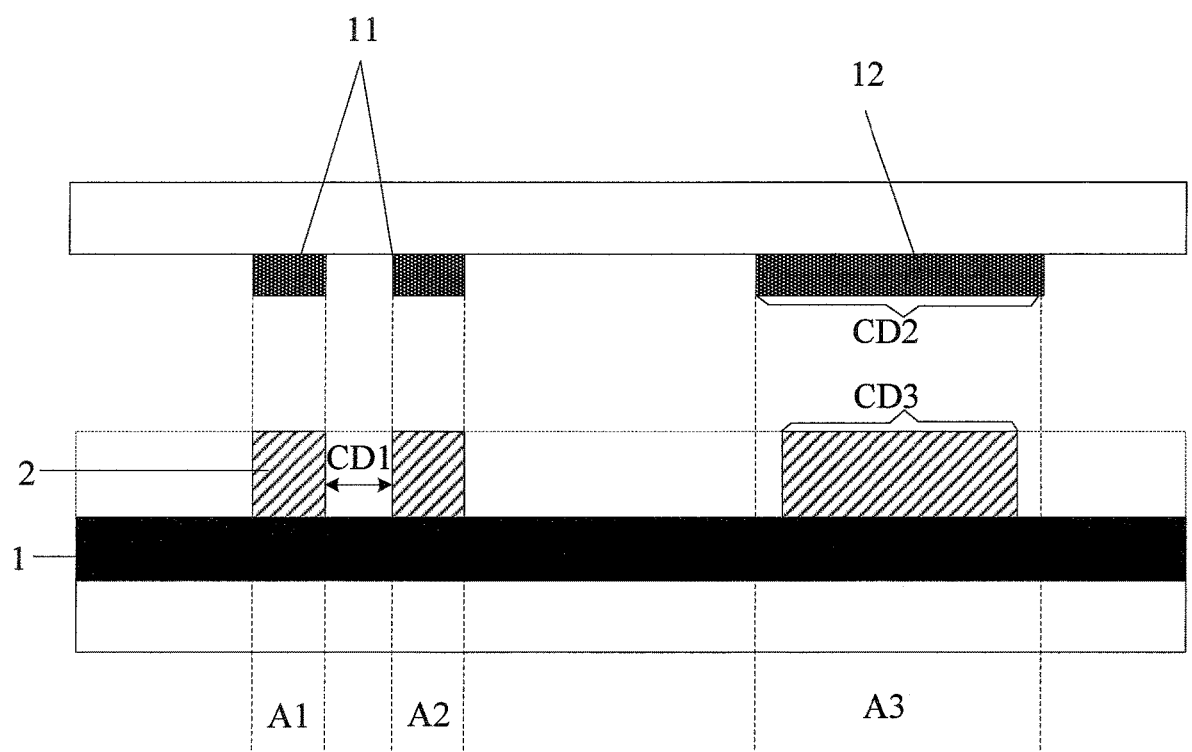
FIG. 1 is a schematic diagram of a phase shift mask in related art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-8. When referring to the figures, like structures and elements shown throughout are indicated with like reference numerals.

A numerical range modified by "approximately" herein means that the upper and lower limits of the numerical range can vary by 10% thereof. A number modified by "approximately" herein means that the number can vary by 10% thereof.

At present, phase shift masks are usually used for fabricating array substrates in process of producing high resolution display panels. For example, as shown in FIG. 1, when an phase shift mask is used for fabricating source electrodes, drain electrodes and data lines in an array substrate, first, a photoresist layer 2 is formed on a metal layer 1, and then the phase shift mask is used for patterning the photoresist layer 2. Electrode light shielding portions 11 of the phase shift mask correspond to the source electrode region A1 and the drain electrode region A2 of the metal layer 1. A wiring light shielding portion 12 of the phase shift mask corresponds to the data line region A3 of the metal layer 1. During exposure, a narrow channel having a size of CD1 is formed between the source electrode region A1 and the drain electrode region A2. In order to ensure the channel size CD1 after exposure can meet a target requirement, a large amount of exposure energy is needed. However, due to the light interference, large exposure energy can cause the wiring light shielding portion 12 to be overexposed. As such, the channel size CD3 of the photoresist layer 2 at the data line region A3 is smaller than the channel size CD2 of the wiring light shielding portion 12 of the phase shift mask. As such, the width of the actually obtained data line is relatively narrow.

A phase shift mask, an array substrate, a fabrication method thereof, and a display apparatus are provided according to some embodiments of the present disclosure to solve the problem that the width of the actually obtained pattern is smaller than the preset width due to overexposure using the phase shift mask.

The shape and the size of each of the portions in the figures do not reflect their real scales and is merely for illustrating the content of the disclosure.

Figure 2:
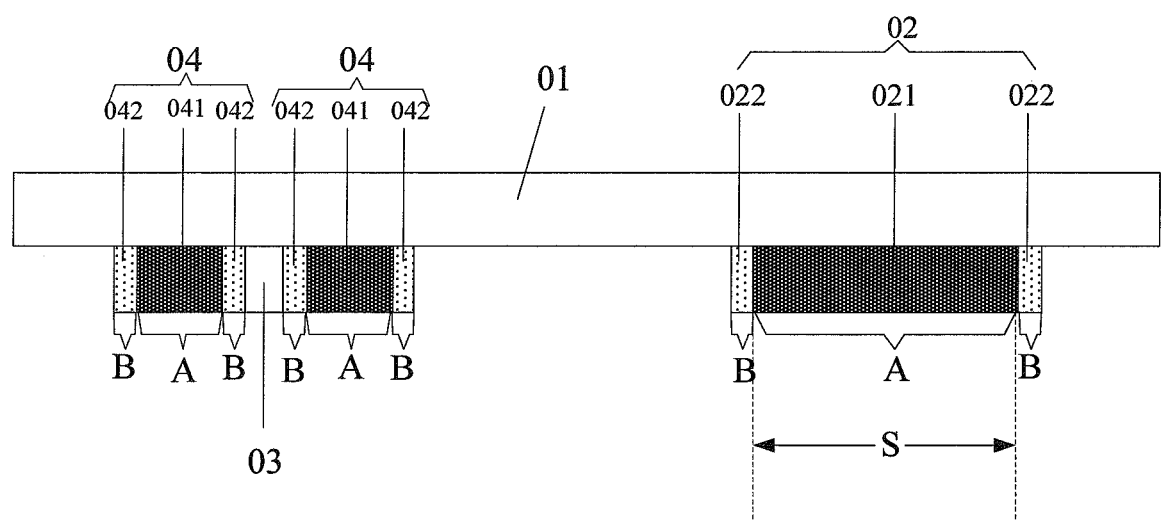
FIG. 2 is a cross-sectional view of a phase shift mask according to some embodiments of the present disclosure.

FIG. 2 shows a cross-sectional view of a phase shift mask according to some embodiments of the present disclosure. As shown in FIG. 2, the phase shift mask includes a substrate 01 and a wiring light shielding portion 02 located on the substrate 01. The wiring light shielding portion 02 includes a light shielding region A and a phase shifting region B. In a direction perpendicular to the extension direction of the wiring light shielding portion 02, the width S of the light shielding region A is larger than the preset width of the pattern formed in the region corresponding to the wiring light shielding portion 02.

Specifically, in the existing phase shift mask, in a direction perpendicular to the extension direction of the wiring light shielding portion, the width of the light shielding portion is equal to the preset width of the formed pattern. However, since the problem of overexposure exists in the region corresponding to the wiring light shielding portion during exposure, the actual width of the formed pattern is smaller than the preset width.

For the phase shift mask provided by the embodiments of the present disclosure, although the region corresponding to the wiring light shielding portion is also overexposed, since the width of the light shielding region is configured to be larger than the preset width of the pattern, the actual width of the formed pattern can be smaller than the width of the light shielding region, but is still larger than the width of the pattern formed by the wiring light shielding portion of the existing phase shift mask. Therefore, the phase shift mask provided by the embodiments of the present disclosure has the advantage that the width of the light shielding region is larger than the preset width of the pattern, so that the actual width of the formed pattern can be equal to the preset width.

Figure 3:
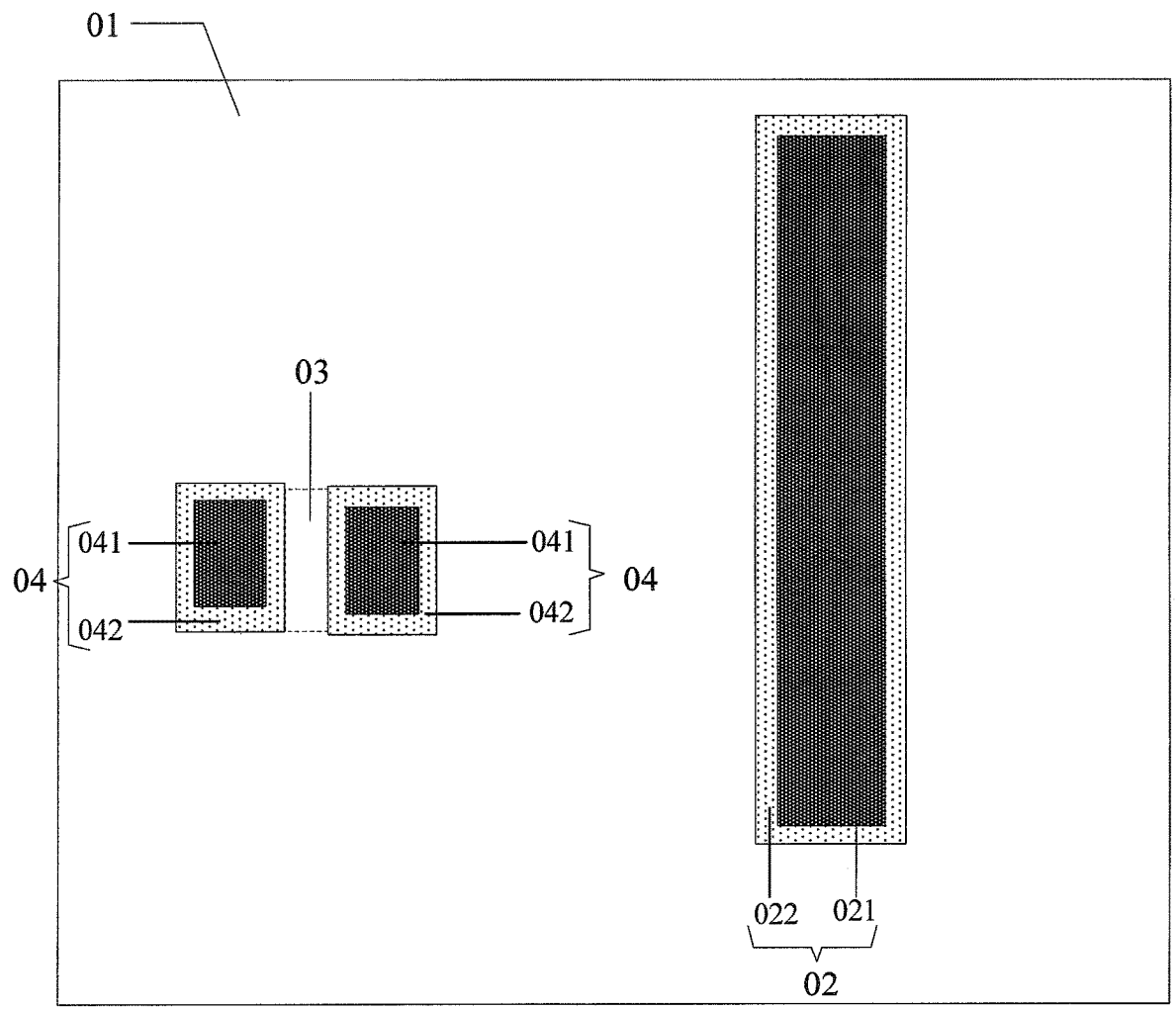
FIG. 3 is a top view of a phase shift mask according to some embodiments of the present disclosure.

In some embodiments, as shown in FIG. 2 and FIG. 3, the phase shift mask further includes a channel light transmitting portion 03 and electrode light shielding portions 04 located on both opposite sides of the channel light transmitting portion 03 respectively.

It should be noted that FIG. 3 is only to illustrate one of the relevant positional relationships among the channel light transmitting portion, the wiring light shielding portion, and the electrode light shielding portions. The shape of the wiring light shielding portion and the electrode light shielding portions are not limited herein, as long as the shape of the wiring light shielding portion is a strip and a channel light transmitting portion is provided between the electrode light shielding portions. The shape of the wiring light shielding portion may be a straight line, as shown in FIG. 3, or a polyline or an arc, and is not limited herein.

In addition, the width of the channel light transmitting portion 03 is a width of the gap between the electrode light shielding portions 04.

In some embodiments, the light shielding portion in the phase shift mask generally has a light shielding region A and a phase shifting region B. The phase shifting region B surrounds the light shielding region A, e.g. the wiring light shielding portion 02 and the electrode light shielding portions 04, as shown in FIG. 2.

Figure 4:
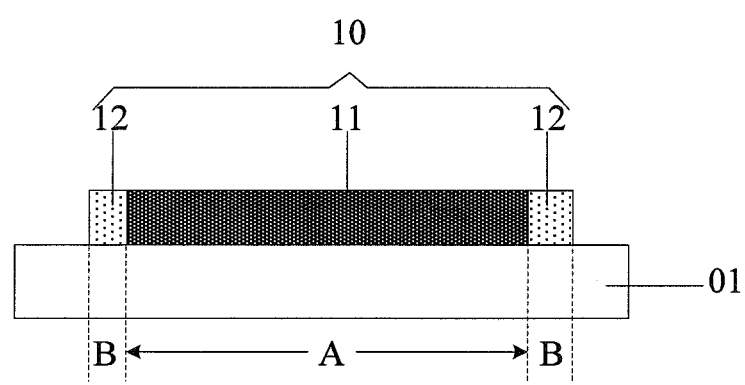
FIG. 4 is a cross-sectional view of a light shielding portion of a phase shift mask according to some embodiments of the present disclosure.
Figure 5:
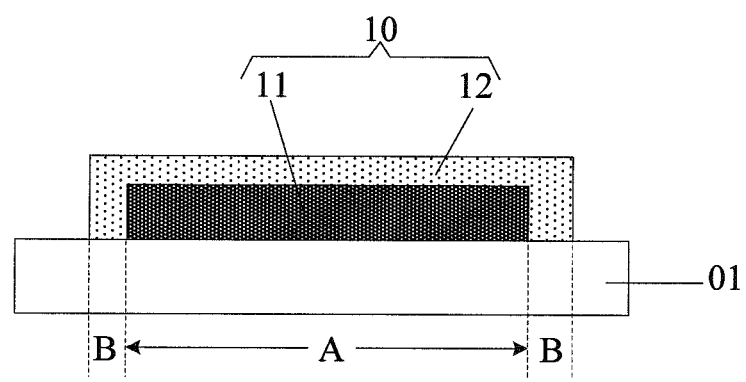
FIG. 5 is a cross-sectional view of a light shielding portion of a phase shift mask according to some embodiments of the present disclosure.
Figure 6:
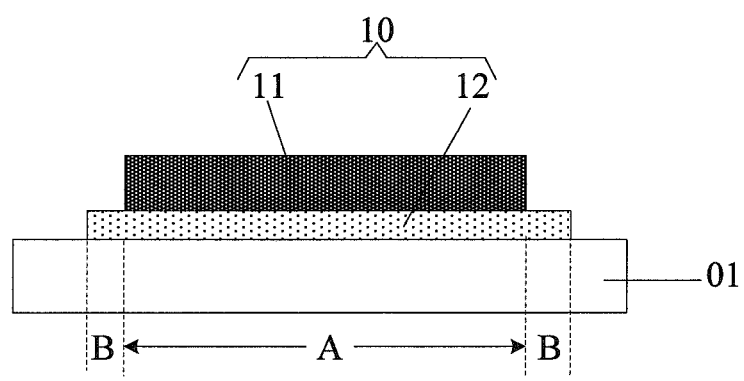
FIG. 6 is a cross-sectional view of a light shielding portion of a phase shift mask according to some embodiments of the present disclosure.

In some embodiments, taking a light shielding portion 10 as an example, as shown in FIGS. 4-6, the light shielding region A is made of a light shielding material 11 such as chromium. The phase shifting region B is made of a phase shifting material 12. The phase shifting material 12 can enable light to generate phase change of 180 degrees. In some embodiments, the width of the phase shift region B is generally controlled between approximately 0 µm to approximately 1 µm, e.g. 0.6 µm. During the fabrication process, in some embodiments, the pattern of the light shielding material can be formed first, then the pattern of the phase shifting material is formed. In some other embodiments, the pattern of the phase shifting material can be formed, and then the pattern of the light shielding material is formed. It is not limited herein. In addition, in some embodiments as shown in FIG. 4, the phase shifting material 12 can only cover the phase shift region B. In some embodiments, as shown in FIG. 5 and FIG. 6, the phase shifting material 12 can also cover the phase shifting region B and the light shielding region A at the same time. It is not limited herein.

Thus, in some embodiments, for the phase shift mask provided according to some embodiments of the present disclosure, the light shielding portion includes a light shielding layer and a phase shifting layer.

In some embodiments, as shown in FIG. 2, in the phase shift mask provided by the embodiments of the present disclosure, the wiring light shielding portion 02 includes a first light shielding layer 021 and a first phase shifting layer 022. The first light shielding layer 021 covers the light shielding region A, and the first phase shifting layer 022 covers at least the phase shifting region B. FIG. 2 shows the first phase shifting layer 022 only covers the phase shifting region B as an example. During actual implementation, the first phase shifting layer 022 can also cover both the light shielding region A and the phase shifting region B.

In some embodiments, as shown in FIG. 2, the electrode light shielding portion 04 in the phase shift mask provided by the embodiments of the present disclosure includes a second light shielding layer 041 and a second phase shifting layer 042. The second light shielding layer 041 covers the light shielding region A, and the second phase shifting layer 042 covers at least the phase shifting region B. FIG. 2 shows that the second phase shifting layer 042 only covers the phase shifting region B as an example, and the second phase shifting layer 042 can also cover both the light shielding region A and the phase shifting region B.

The material of the first light shielding layer and the material of the second light shielding layer may be the same, which is not limited herein.

The material of the first phase shifting layer and the material of the second phase shifting layer may be the same, which is not limited herein.

In actual implementation, the substrate of the phase shift mask may be made of a transparent material. In the phase shift mask, except the light shielding portions, all the other regions are light transmitting regions. The light transmitting portions are located in the light transmitting region between the light shielding portions. The light transmitting portions can be filled with a light transmitting material or not filled with any material, which is not limited herein. The channel light transmitting portion is a light transmitting portion with the size smaller than a certain value. As such, the channel light transmitting portion would require larger exposure energy during exposure than the other light transmitting portions.

In some embodiments, the phase shift mask provided by the embodiments of the present disclosure is suitable for any patterning which needs to form a narrow channel and a wide channel in a film layer at the same time. Forming a narrow channel in a film layer requires high exposure energy. Forming a wide channel requires relatively low exposure energy. In order to form the narrow channel, the wide channel can be overexposed. As such, the obtained width of the wide channel is larger than the actual desired width. Therefore, the width of the pattern at the edge of the wide channel, that is, the width of the pattern formed by the wiring light shielding portion, is smaller than the preset width. According to the phase shift mask provided by the embodiments of the present disclosure, the width of the light shielding region of the wiring light shielding portion is increased, thereby ensuring that the width of the pattern formed after the overexposure is equal to the preset width of the pattern.

In some embodiments, taking the phase shift mask being applied to an array substrate as an example, the electrode light shielding portions 04 are generally used for forming source electrodes and drain electrodes. The wiring light shielding portions 02 are generally used for forming data lines. The channel light transmitting portion 03 corresponds to the gap between the source electrode and the drain electrode. Since the width of the channel light transmitting portion 03 is relatively narrow, in order to ensure the size of the channel between the source electrode and the drain electrode after exposure can meet the requirement, the required exposure energy is large. If an existing phase shift mask is adopted, the large exposure energy would cause overexposure of the wiring light shielding portion. As a result, the width of the data line is smaller than the preset width. According to the phase shift mask provided by the embodiments of the present disclosure, the width of the light shielding region is configured to be larger than the preset width of the data line. As such, although the width of the formed data line becomes narrower than the width of the light shielding region, it can still meet the preset width.

In some embodiments, in the phase shift mask provided by the embodiment of the present disclosure, the difference between the width of the light shielding region of the wiring light shielding portion and the preset width of the wiring is a compensation width. The compensation width is related to the width of the channel light transmitting portion. This is because during exposure, the overexposure of the wiring light shielding portion is caused by the width of the channel light transmitting portion being smaller than the width of the other light transmitting regions in the phase shift mask. Therefore, the degree of overexposure of the wiring light shielding portion is normally determined by the width of the channel light transmitting portion. The narrower the channel light transmitting portion, the larger degree of overexposure of the wiring light shielding portion and the wider the corresponding compensation width. On the contrary, the wider the width of the channel light transmitting portion, the lower degree of overexposure of the wiring light shielding portion and the narrower the corresponding compensation width.

Therefore, in the phase shift mask according to the embodiments of the present disclosure, the compensation width is in negative correlation with the width of the channel light transmitting portion.

Specifically, through tests, it is found that when the thickness of the photoresist is not considered, the compensation width and the width of the channel light transmitting portion satisfies the following relationship:

$$\begin{cases} \frac{y}{2} = Kx + b \\ -1 \le K \le -2 \\ 3 \le b \le 4 \end{cases}$$

Wherein, y represents the compensation width, and x represents the width of the channel light transmitting portion. K and b are constants.

In some embodiments, the required exposure energy is different when the thicknesses of the photoresist vary. A small thickness requires relatively small exposure energy. A large thickness requires relatively large exposure energy. For the phase shift mask provided by the embodiments of the present disclosure, the pattern to be formed on the surface of the substrate may have different height. As such, the thickness of the photoresist is not consistent.

Therefore, considering the influence of the thickness of the photoresist, for the phase shift mask provided by the embodiments of the present disclosure, the compensation width and the width of the channel light transmitting portion satisfy the following relationship:

$$\begin{cases} \frac{y}{2} = Kx + b + 0.1 * \Delta T \\ -1 \le K \le -2 \\ 3 \le b \le 4 \end{cases}$$

Wherein y represents the compensation width, x represents the width of the channel light transmitting portion, and $\Delta T$ represents the difference between the thickness of the photoresist in the corresponding region of the channel light transmitting portion and the thickness of the photoresist in the corresponding region of the wiring light shielding portion during exposure of the phase shift mask, that is, a result of the thickness of the photoresist in the corresponding region of the channel light transmitting portion minus the thickness of the photoresist in the corresponding region of the wiring light shielding portion.

Figure 7:
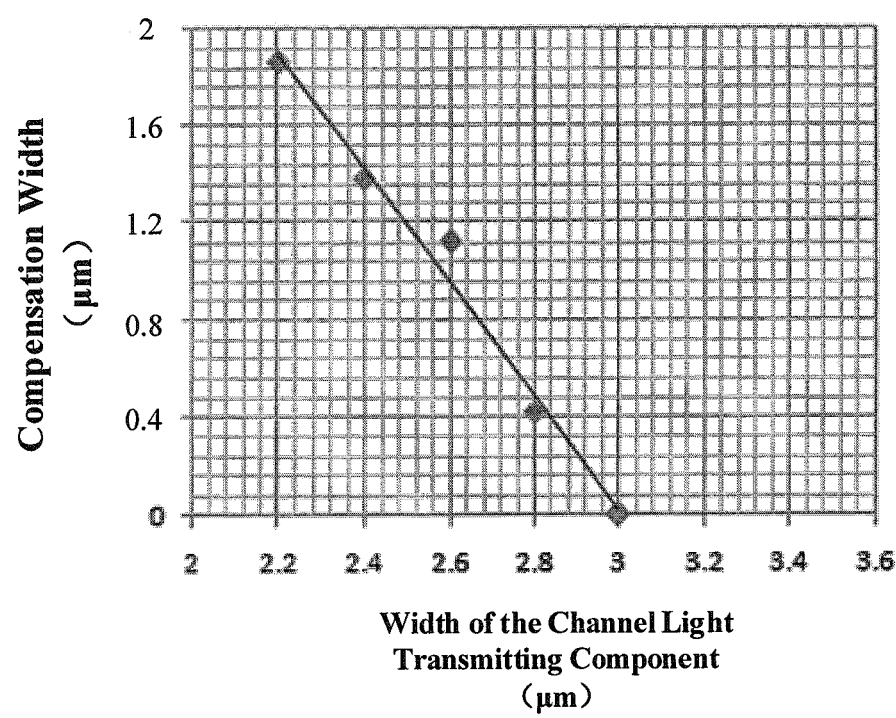
FIG. 7 is a relationship of a compensation width with a width of the channel light transmitting portion according to some embodiments of the present disclosure.

The compensation widths are measured at different sizes of the channel light transmitting portions. FIG. 7 shows the results. According to the results, K is approximately equal to −1.17, and b is approximately equal to 3.52. Thus, in some embodiments, in the phase shift mask provided by the embodiments of the present disclosure, K is equal to −1.17 and b is equal to 3.52.

Based on the same inventive concept, a method of fabricating an array substrate is provided according to the embodiments of the present disclosure. The method includes the following steps:

A metal layer is formed on a substrate.

The metal layer is patterned using the phase shift mask provided by the embodiments of the present disclosure. A pattern of metal wiring is formed in the region of the metal layer corresponding to the wiring light shielding portion.

In some embodiment, in the fabrication method provided by the embodiments of the present disclosure, before the metal layer is formed on the substrate, the method further includes the following steps:

A pattern of a gate electrode is formed on the substrate.

A gate electrode insulating layer which covers the pattern of the gate electrode is formed.

A pattern of a semiconductor layer is formed on the gate insulating layer.

In some embodiments, in the fabrication method provided by the embodiments of the present disclosure, the phase shift mask further includes a channel light transmitting portion and electrode light shading portions located on both opposite sides of the channel light transmitting portion. When the metal layer is patterned by the phase shift mask, the method further includes the following steps:

A channel is formed in the region of the metal layer corresponding to the channel light transmitting portion. A pattern of the drain electrode and a pattern of the source electrode are formed in the region of the metal layer corresponding to the electrode light shielding portions respectively.

Figure 8A:
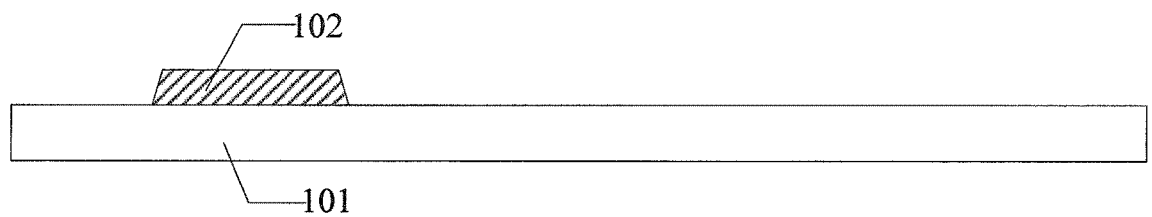
FIGS. 8a-8f are schematic diagrams of a method of fabricating an array substrate provided by some embodiments of the present disclosure.

The fabrication method of the array substrate is provided according to some embodiments of the present disclosure. The method includes the following steps:

(1) As shown in FIG. 8*a*, a pattern of a gate electrode 102 is formed on the substrate 101.

Figure 8B:
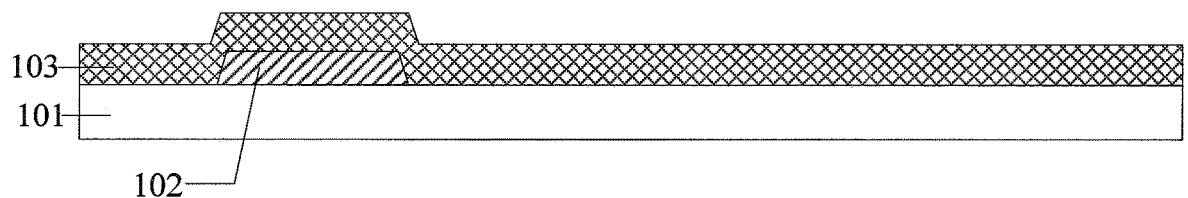

(2) As shown in FIG. 8*b*, a gate insulating layer 103 covering the pattern of the gate electrode 102 is formed.

Figure 8C:
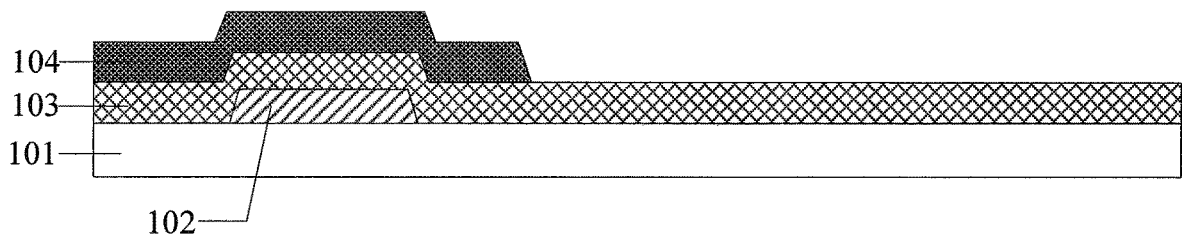

(3) As shown in FIG. 8c, a pattern of a semiconductor layer 104 is formed on the gate insulating layer 103.

Figure 8D:
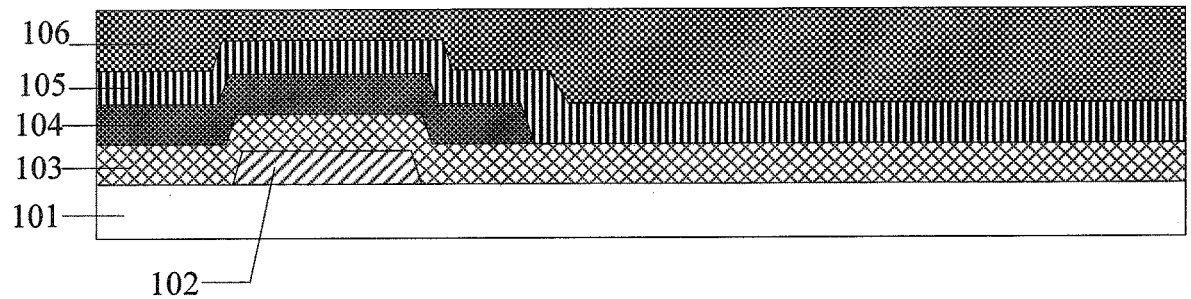

(4) As shown in FIG. 8d, a metal layer 105 and a photoresist layer 106 are sequentially formed on the pattern of the semiconductor layer 104.

Figure 8E:
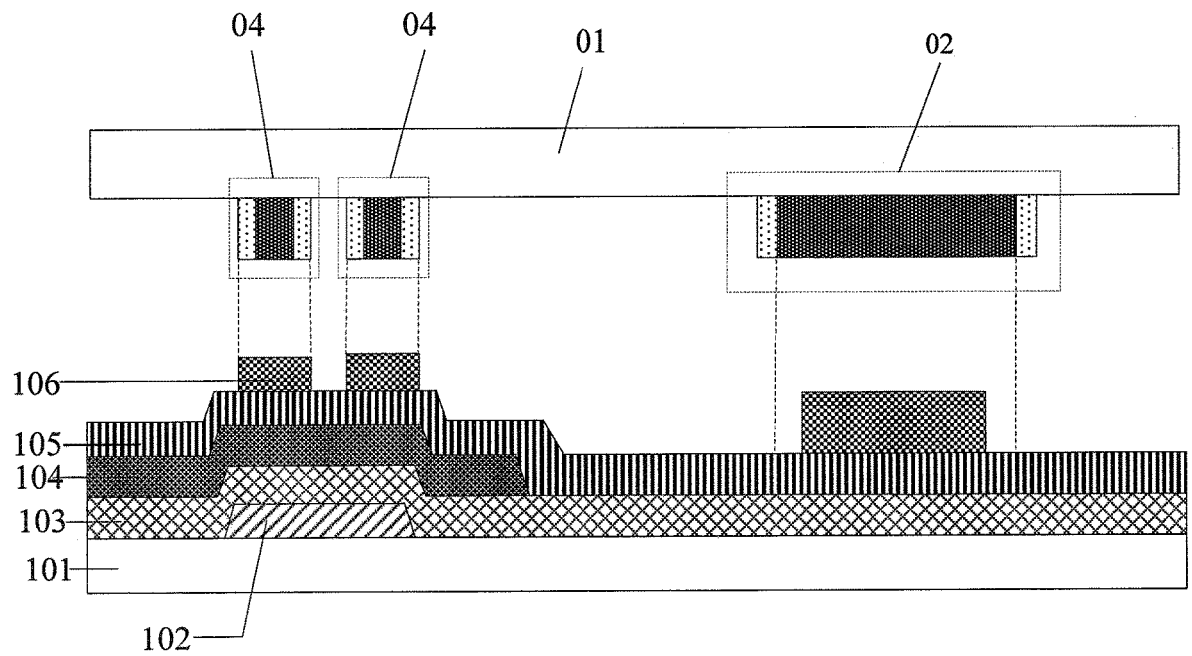

(5) The photoresist layer 106 is exposed by adopting the phase shift mask shown in FIG. 2 to form a pattern as shown in FIG. 8e.

Figure 8F:
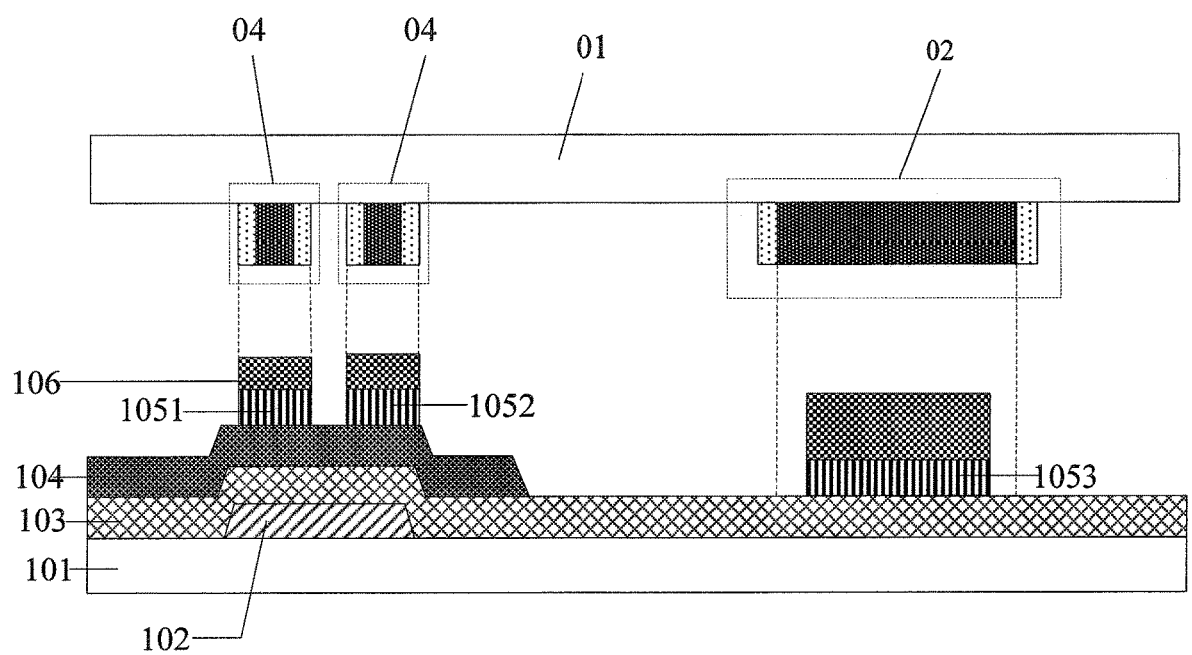

(6) As shown in FIG. 8f, the metal layer 105 is patterned with the residual photoresist layer 106 as a mask. The pattern of the source electrode 1051 and the pattern of the drain electrode 1052 are formed in the region of the metal layer 105 corresponding to the electrode light shielding portions 04. A metal wiring 1053 is formed in the region of the metal layer 105 corresponding to the wiring light shielding portion 02.

Based on the same inventive concept, an array substrate is provided according to some embodiments of the present disclosure. The array substrate is prepared by adopting the fabrication method of the array substrate. The principle of solving the problem of the array substrate is similar to the fabrication method of the array substrate. Thus, the implementation of the array substrate can be referred to the implementation of the fabrication method, and is not repeated herein.

Based on the same inventive concept, a display apparatus is provided according to some embodiments of the present disclosure. The display apparatus includes the array substrate provided by the embodiments of the present disclosure. The display apparatus can be a mobile phone, a tablet computer, a television, a display, a notebook computer, a digital photo frame, a navigator and other products or portions with a display function. According to the embodiments of the display apparatus, reference can be made to the embodiments of the array substrate, and is not repeated herein.

A phase shift mask, an array substrate, a fabrication method thereof, and a display apparatus are provided according to some embodiments of the present disclosure. During exposure of the phase shift mask, even though the region corresponding to the wiring light shielding portion is overexposed, the width of light shielding region is preconfigured to be larger than the preset width of the pattern. The actual width of the formed pattern can be smaller than the width of the light shielding region, but is still larger than the width of the pattern formed by the wiring light shielding portion of the existing phase shift mask. Therefore, in the phase shift mask provided by the embodiment of the disclosure, the width of the light shielding region is larger than the preset width of the pattern. As such, the actual width of the formed pattern can be equal to the preset width.

In the description of the specification, references made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should cover other technical schemes which are formed by combining the technical features or the equivalent features of the technical features without departing from the inventive concept. What is more, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A method of fabricating an array substrate, comprising:
   forming a metal layer on a substrate; and
   patterning the metal layer using a phase shift mask to form a pattern of metal wiring,
   wherein the phase shift mask comprises a substrate and a wiring light shielding portion on the substrate; the wiring light shielding portion comprises a light shielding region and a phase shifting region, and in a direction perpendicular to an extension direction of the wiring light shielding portion, a width of the light shielding region is larger than a width of the pattern of the metal wiring formed by the wiring light shielding portion;
   wherein the phase shift mask further comprises a channel light transmitting portion and two electrode light shielding portions on both opposite sides of the channel light transmitting portion, and patterning the metal layer using the phase shift mask further comprises:
   forming a pattern of a drain electrode and a pattern of a source electrode by the electrode light shielding portions, and a channel between the pattern of the drain electrode and the pattern of the source electrode;
   wherein a difference between the width of the light shielding region and the width of the pattern of the metal wiring is a compensation width, and the compensation width is negatively correlated to a width of the channel light transmitting portion.

2. The fabrication method according to claim 1, before the metal layer is formed on the substrate, further comprising:
   forming a pattern of a gate electrode on the substrate;
   forming a gate insulating layer covering the pattern of the gate electrode; and
   forming a pattern of a semiconductor layer on the gate insulating layer.

3. The fabrication method according to claim 1, wherein the compensation width and the width of the channel light transmitting portion meets the following relationship: wherein y represents the compensation width, x represents the width of the channel light transmission portion, and K and b are constants.

4. The fabrication method according to claim 3, wherein K is approximately equal to 1.17 and b is approximately equal to 3.52.

5. The fabrication method according to claim 1, wherein the compensation width and the width of the channel light transmitting portion meet the following relationship: wherein y represents the compensation width, x represents the width of the channel light transmitting portions, and ΔT represents a difference between a thickness of photoresist in a region of the channel light transmitting portion and a thickness of photoresist in a region of the wiring light shielding portion.

6. The fabrication method according to claim 1, wherein the wiring light shielding portion comprises a light shielding layer and a phase shifting layer, the light shielding layer covers the light shielding region, and the phase shifting layer covers at least the phase shifting region.

7. The fabrication method according to claim 6, wherein the phase shifting layer covers both the light shielding region and the phase shifting region.

8. The fabrication method according to claim 7, wherein a shape of the wiring light shielding portion is a strip.

9. The fabrication method according to claim 6, wherein the light shielding layer is made of chromium.

10. The fabrication method according to claim 6, wherein the phase shifting layer is made of a phase shifting material, wherein the phase shifting material is configured to enable light to generate phase change of 180 degrees.

11. An array substrate fabricated by the method according to claim 1.

12. A display apparatus comprising the array substrate according to claim 11.

13. A phase shift mask, comprising:
a substrate; and
a wiring light shielding portion on the substrate;
wherein the wiring light shielding portion comprises a light shielding region and a phase shifting region, and in a direction perpendicular to an extension direction of the wiring light shielding portion, a width of the light shielding region is larger than a width of a pattern formed by the wiring light shielding portion; and
the phase shift mask further includes:
a channel light transmitting portion; and
two electrode light shielding portions respectively on both opposite sides of the channel light transmitting portion;
wherein a difference between the width of the light shielding region and the width of the pattern is a compensation width, and the compensation width is negatively correlated to a width of the channel light transmitting portion.

14. The phase shift mask according to claim 13, wherein the compensation width and the width of the channel light transmitting portion meets the following relationship: wherein, y represents the compensation width, x represents the width of the channel light transmission portion, and K and b are constants.

15. The phase shift mask according to claim 13, wherein the compensation width and the width of the channel light transmitting portion meet the following relationship: wherein y represents the compensation width, and x represents the width of the channel light transmitting portions, the ΔT represents a difference between a thickness of photoresist in a corresponding region of the channel light transmitting portion and a thickness of photoresist in a corresponding region of the wiring light shielding portion during exposure.

16. The phase shift mask according to claim 13, wherein the wiring light shielding portion comprises a light shielding layer and a phase shifting layer;
wherein the light shielding layer covers the light shielding region, and the phase shifting layer covers at least the phase shifting region.

17. The phase shift mask according to claim 16, wherein the phase shifting layer covers both the light shielding region and the phase shifting region.

* * * * *